(12) United States Patent　(10) Patent No.: US 7,801,706 B2
Enomoto et al.　(45) Date of Patent: Sep. 21, 2010

(54) STRUCTURAL OPTIMIZATION SYSTEM

(75) Inventors: Hirohisa Enomoto, Hitachinaka (JP); Shigeru Sakamoto, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 636 days.

(21) Appl. No.: 11/834,716

(22) Filed: Aug. 7, 2007

(65) Prior Publication Data

US 2008/0033703 A1　Feb. 7, 2008

(30) Foreign Application Priority Data

Aug. 7, 2006　(JP) .............................. 2006-214271

(51) Int. Cl.
  *G06F 17/50* (2006.01)
(52) U.S. Cl. .................... 703/1; 703/6; 703/7
(58) Field of Classification Search ............ 700/97, 700/98, 103–105, 108–110; 703/1, 6–7
See application file for complete search history.

(56) References Cited

U.S. PATENT DOCUMENTS

| | | | |
|---|---|---|---|
| 6,678,627 B1 * | 1/2004 | Starr | 702/119 |
| 2005/0021315 A1 * | 1/2005 | Alleai | 703/1 |
| 2005/0273302 A1 * | 12/2005 | Huang et al. | 703/10 |
| 2006/0052990 A1 * | 3/2006 | Iimori | 703/7 |
| 2009/0306802 A1 * | 12/2009 | Cone | 700/98 |
| 2010/0004912 A1 * | 1/2010 | Guist | 703/7 |

FOREIGN PATENT DOCUMENTS

| | | |
|---|---|---|
| JP | 10-207926 | 8/1998 |
| JP | 2004-070397 | 3/2004 |

OTHER PUBLICATIONS

Cottrell et al., Isogeometric analysis of structural vibrations, Sep. 2005, Comput. Methods Appl. Mech. Engrg. 195, pp. 5257-5296.*

* cited by examiner

*Primary Examiner*—Paul L Rodriguez
*Assistant Examiner*—Aniss Chad
(74) *Attorney, Agent, or Firm*—Antonelli, Terry, Stout & Kraus, LLP.

(57) ABSTRACT

It includes: a part which changes a computer-aided design model according to a design variable and outputs it; a part which calculates and outputs natural vibration modes and natural frequencies; a part which makes a natural vibration mode image; a part which binarizes a natural vibration mode image by a threshold value to make a binary image; a part which extracts pattern information from a binary image and outputs it together with the image; a part for distinguishing natural vibration mode which, using pattern information, distinguishes the natural vibration mode to be tracked from natural vibration modes after deformation and outputs it; and a part for calculating optimum solution which finds a design variable which makes the natural frequency of a natural vibration mode a target value and outputs it. Thereby, the structural optimization system can easily distinguish and track natural vibration modes through computer-aided design model change in structural design.

9 Claims, 16 Drawing Sheets

STRUCTURAL OPTIMIZATION SYSTEM

CLAIM OF PRIORITY

The present application claims priority from Japanese application JP 2006-214271 filed on Aug. 7, 2006, the content of which is hereby incorporated by reference into this application.

BACKGROUND OF THE INVENTION (1) Field of the Invention

The present invention relates to structural optimization systems and more particularly to a structural optimization system which supports design work concerning structural vibrations.

(2) Description of the Related Art

A structure such as a mechanical apparatus has a specific frequency of vibration at which vibration increases when a force is applied, and at this frequency of vibration, the structure vibrates in a specific deformation pattern. This frequency of vibration is called natural frequency and this deformation pattern is called natural vibration mode. There are many combinations of natural frequencies and natural vibration modes in structures. When a natural frequency is very close to the frequency of a force being applied, resonance may occur where vibration is very large. Therefore, a computer-aided design which prevents resonance is generally pursued in designing a structure such as a mechanical apparatus.

In design concerning structural vibrations, a natural vibration mode which is likely to cause resonance must be tracked and the natural frequency corresponding to the natural vibration mode being tracked is set as a target value. In this process, calculation methods including the finite element method are used so that the final structure is determined through repeated computer-aided design (geometrical) model changes using, as parameters, many design variables such as structural size and positions and quantities of components. This is a common problem which often arises in designing a structure such as a mechanical apparatus.

Since a parameter survey for design of an actual structure usually requires considerable cost in terms of both time and labor, automation of this process as described in Japanese Patent Application Laid-Open Publication No. H10-207926 is effective. In the structural optimization system disclosed in Japanese Patent Application Laid-Open Publication No. H10-207926 (design support system for structures and the like), a parameter survey for issues related to statics is automated.

A popular method of tracking a specific natural vibration mode is that as described in Japanese Patent Application Laid-Open Publication No. 2004-70397, a natural vibration mode is regarded as a vector and a natural vibration mode which has the highest correlativity according to the value of inner product is tracked.

Natural vibration modes as calculation results obtained by a calculation method like the finite element method are outputted in the descending order of natural frequency. As for the problem of vibration, when a design variable is changed, the order of occurrence among many natural vibration modes may change. Taking a cantilever beam as an example, how the order of occurrence of natural vibration modes changes will be explained below with reference to FIG. 15. As the plate width of the cantilever beam becomes smaller, the natural frequency of the natural vibration mode for bending decreases and the natural frequency of the natural vibration mode for torsion increases. Contrariwise, as the plate width of the cantilever beam becomes larger, the natural frequency of the natural vibration mode for bending increases and the natural frequency of the natural vibration mode for torsion decreases. Thus, the order of occurrence of natural vibration modes changes depending on the cantilever beam plate width. Therefore, in order to find a structure in which the natural frequency of the natural vibration mode which easily causes resonance is far different from the exciting frequency, a specific vibration mode should be pursued and tracked through repeated computer-aided design model changes. However, the structural optimization system described in Japanese Patent Application Laid-Open Publication No. H10-207926, which does not involve this kind of natural vibration mode tracking, is not satisfactory in addressing the vibration problem.

One method of tracking a specific natural vibration mode is to investigate a natural vibration mode with the highest correlativity according to the value of inner product square where a natural vibration mode is regarded as a vector as described in Japanese Patent Application Laid-Open Publication No. 2004-70397. However, this method is not suitable for use in calculation methods widely used in structural optimization design such as the finite element method. More specifically, in a calculation method in which a discrete physical model is substituted for a structure as an object, like the finite element method, equations are represented on a discrete space lattice (space lattice is called mesh and points constituting the lattice are called nodes). In this method, when a computer-aided design model is changed, nodes are renumbered as shown in FIG. 16. For this reason, it is hard to say that it is always useful to use an algorithm for tracking natural vibration modes by squaring the inner product.

SUMMARY OF THE INVENTION

An object of the present invention is to provide a structural optimization system which makes it easy to distinguish and track natural vibration modes through computer-aided design model change in structural design and thereby supports vibration-related design work more effectively.

In order to achieve the above object, according to the present invention, a structural optimization system includes: a part for changing computer-aided design models which receives a computer-aided design model and a design variable and changes the computer-aided design model according to the design variable and outputs it; a part of calculation which receives a computer-aided design model from the part for changing computer-aided design model and calculates a natural vibration mode and a natural frequency and outputs them; a part for making natural vibration mode image which receives a natural vibration mode from the part of calculation and makes a natural vibration mode image as a visualized form of the natural vibration mode and outputs it; a part of binarization which receives a natural vibration mode image from the part for making natural vibration mode image and binarizes the natural vibration mode image by a threshold value and outputs a binary image; a part for extracting pattern information which receives a binary image from the part of binarization and extracts pattern information from the binary image and outputs it together with the binary image; a part for distinguishing natural vibration mode which receives a binary image from the part of binarization and pattern information from the part for extracting pattern information and distinguishes the natural vibration mode to be tracked from natural vibration modes after computer-aided design model deformation using the pattern information and outputs it; and a part for calculating optimum solution which receives a natural vibration mode from the part for distinguishing natural vibration mode and finds a design variable which makes the natural frequency of the natural vibration mode a target value and outputs it.

The above basic system according to the invention is embodied in more preferred forms as follows.

(1) In the basic system, the part for distinguishing natural vibration mode includes: a first part for distinguishing natural vibration mode which distinguishes a natural vibration mode considered identical to the natural vibration mode to be tracked using, out of pattern information on a main component best expressing characteristics of a natural vibration mode from the part for extracting pattern information, pattern information viewed from the same main direction as the main component, and outputs it; and a second part for distinguishing natural vibration mode which, when the first part for distinguishing natural vibration mode cannot distinguish a natural vibration mode considered identical to the natural vibration mode to be tracked, distinguishes a natural vibration mode considered identical to the natural vibration mode to be tracked, using, out of the pattern information on the main component, pattern information viewed from a direction other than the main direction, and outputs it. Here the part for calculating optimum solution receives a natural vibration mode from the first part for distinguishing natural vibration mode and the second part for distinguishing natural vibration mode and finds a design variable which makes the natural frequency of the natural vibration mode a target value, and outputs it.

(2) In the system described above in (1), the part for making natural vibration mode image is a part for making gray scale image which makes a gray scale image which expresses a natural vibration mode from the part of calculation by amplitude or expresses a strain energy distribution or kinetic energy distribution of vibration in the natural vibration mode by color tones, and regards it the natural vibration mode image; the part of binarization sets a threshold value for tones in a gray scale image made by the part for making gray scale image and divides the image into white pixel regions and black pixel regions to make a binary image; the part for extracting pattern information counts a series of white pixels in a binary image extracted by the part of binarization as one group and a series of black pixels in it as one group and extracts the number of white groups and the number of black groups as pattern information; the first part for distinguishing natural vibration mode distinguishes a natural vibration mode considered identical to the natural vibration mode to be tracked, from natural vibration modes after computer-aided design model change, using the number of white groups and the number of black groups as the pattern information, and outputs it; and the second part for distinguishing natural vibration mode distinguishes a natural vibration mode considered identical to the natural vibration mode to be tracked, from natural vibration modes after computer-aided design model change, using the number of white groups and the number of black groups as the pattern information, and outputs it.

(3) The basic system further includes: a part for choosing main component which receives the binary images and pattern information extracted by the part for extracting pattern information, chooses a binary image with a natural vibration mode referred to as the natural vibration mode to be tracked, chooses a binary image of a component in which the amplitude of the chosen natural vibration mode or strain energy or kinetic energy of vibration in the natural vibration mode is maximum, and outputs a binary image expressing the component and its pattern information; and a storing part which receives the binary image and pattern information chosen by the part for choosing main component and stores and outputs it. Here, the part for distinguishing natural vibration mode compares a binary image and pattern information of an unchanged computer-aided design model from the storing part, with a binary image and pattern information of a changed computer-aided design model from the part for extracting pattern information, and distinguishes a natural vibration mode considered identical to the natural vibration mode to be tracked, from natural vibration modes after computer-aided design model change.

(4) The system described in (2) further includes: a part for choosing main component which receives the binary images and pattern information including the number of white groups and the number of black groups, extracted by the part for extracting pattern information, chooses a binary image with a natural vibration mode referred to as the natural vibration mode to be tracked, chooses a binary image of a component in which the amplitude or strain energy of the chosen natural vibration mode is maximum, and outputs a binary image expressing the component and its pattern information including the number of white groups and the number of black groups; and a storing part which receives the binary image chosen by the part for choosing main component and its pattern information including the number of white groups and the number of black groups and stores and outputs them. Here, the first part for distinguishing natural vibration mode compares a binary image and pattern information of an unchanged computer-aided design model from the storing part, with a binary image and pattern information of a changed computer-aided design model from the part for extracting pattern information, and distinguishes a natural vibration mode considered identical to the natural vibration mode to be tracked, from natural vibration modes after computer-aided design model change, and the second part for distinguishing natural vibration mode compares a binary image and pattern information of an unchanged computer-aided design model from the storing part, with a binary image and pattern information of a changed computer-aided design model from the first part for distinguishing natural vibration mode, and distinguishes a natural vibration mode considered identical to the natural vibration mode to be tracked, from natural vibration modes after computer-aided design model change.

(5) The basic system further includes a part for choosing component to be viewed which receives a computer-aided design model calculated by the part of calculation, chooses a component necessary for distinguishing, from the computer-aided design model and outputs only the chosen component.

(6) The basic system further includes a part for choosing component to be viewed which receives a computer-aided design model calculated by the part of calculation, specifies a cross section point of the computer-aided design model, divides the model at this point and outputs the sectionally divided model.

(7) In the system described in (2), the part for making natural vibration mode image is a part for making gray scale image which makes a gray scale image which expresses a natural vibration mode from the part of calculation by color tones according to amplitude or strain energy and regards it the natural vibration mode image; and the part of binarization sets a threshold value for tones in a gray scale image from the part for making gray scale image and divides the image into black pixel regions and white pixel regions to make a binary image. The system further includes a part for distinguishing natural vibration mode by area ratio which receives a binary image made by the part of binarization and calculates the area ratio of white pixels in the binary image and distinguishes, based on the ratio, a natural vibration mode considered identical to the natural vibration mode to be tracked, from natural vibration modes after computer-aided design model change, and outputs it.

(8) In the basic system, the part for distinguishing natural vibration mode receives a binary image with a natural vibration mode referred to as the natural vibration mode to be tracked, and a binary image with a natural vibration mode from the part for extracting pattern information, and counts pixels with identical colors in identical positions between the binary image with the natural vibration mode to be tracked and a binary image with a natural vibration mode calculated after computer-aided design model change, and distinguishes a natural vibration mode with the largest number of such pixels as identical to the natural vibration mode to be tracked.

Therefore, a structural optimization system according to the present invention makes it easy to distinguish a natural vibration mode through computer-aided design model change involved in structural design and track it, which supports vibration-related design work more effectively.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1:
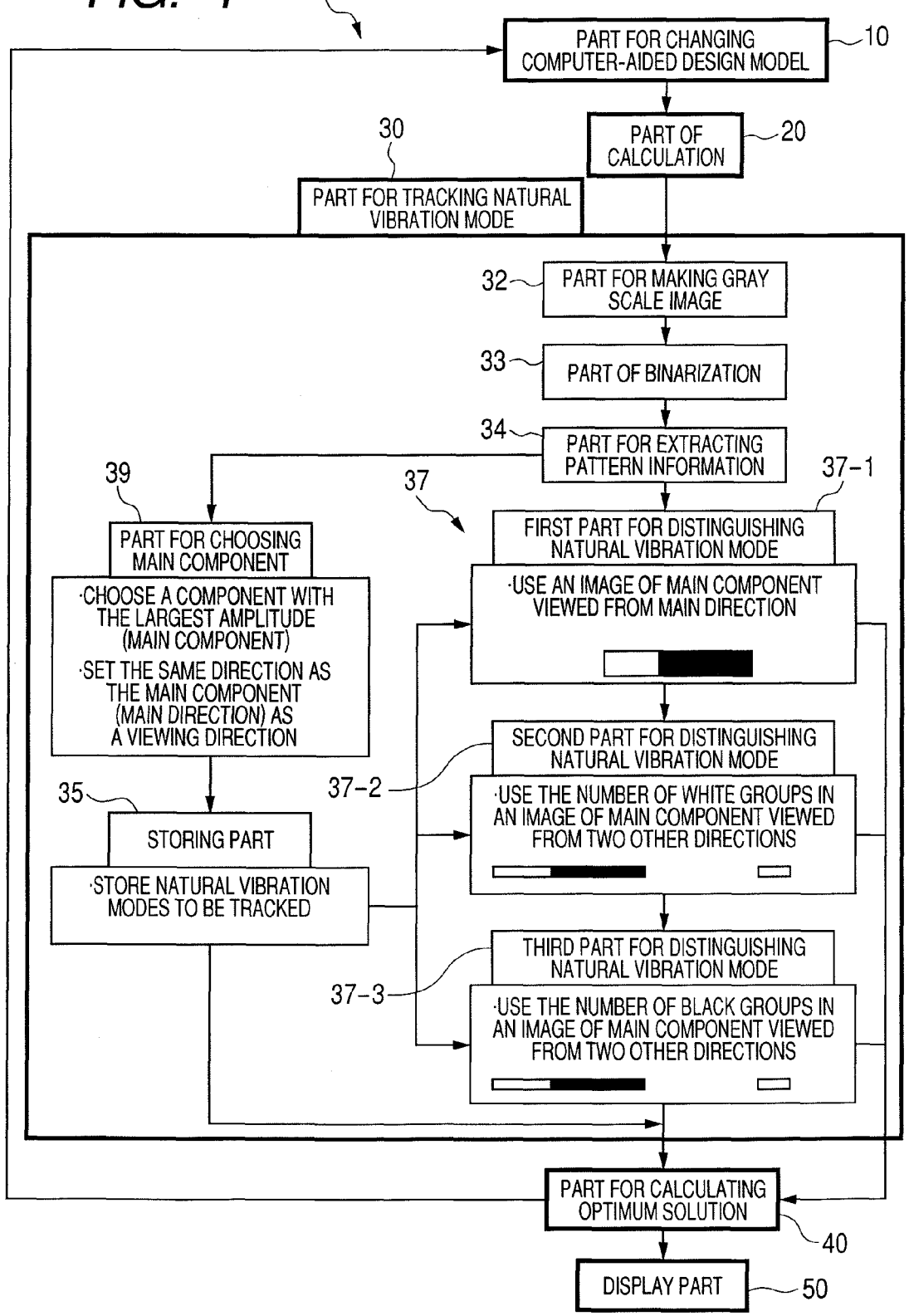
FIG. 1 shows structural optimization programs in a structural optimization system according to a first embodiment of the invention.

Next, the preferred embodiments of the present invention will be described referring to FIGS. 1 to 14. The elements designated by the same reference numerals in the embodiments are the same or equivalent elements.

First Embodiment

A structural optimization system according to a first embodiment of the present invention will be described referring to FIGS. 1 to 7.

First, a structural optimization system 100 in this embodiment will be outlined. The structural optimization system 100 calculates a design variable for optimizing a structure by changing a computer-aided design model successively, and includes a part for tracking natural vibration mode 30 which distinguishes and tracks the natural vibration mode to be tracked through successive changes of a computer-aided design model.

The part for tracking natural vibration mode 30 includes: a part for making natural vibration mode image which makes a natural vibration mode image as a visualized form of a natural vibration mode; a part for extracting pattern information 34 which extracts pattern information for distinguishing the natural vibration mode to be tracked, from the natural vibration mode image; and a part for distinguishing natural vibration mode 37 which distinguishes the natural vibration mode to be tracked, based on the pattern information.

The part for making natural vibration mode image includes a part for making gray scale image 32 which receives a natural vibration mode obtained by vibration characteristic calculation and makes a gray scale image expressing the natural vibration mode by color tones according to the amplitude.

The structural optimization system 100 further includes a part of binarization 33 which receives a gray scale image and sets a threshold value for tones in the gray scale image to make a binary image in which the gray scale image is binarized into black (dark) pixel regions and white (light) pixel regions. The part for extracting pattern information 34 receives a binary image and counts a region with continuous black pixels as one group and a region with continuous white pixels as one group and extracts the numbers of these groups as pattern information.

The structural optimization system 100 further includes a part for choosing main component 39 which chooses a natural vibration mode referred to as the natural vibration mode to be tracked and chooses a component in which the amplitude of the natural vibration mode is maximum, and outputs a binary image showing the component, and the number of white groups and the number of black groups.

The structural optimization system 100 further includes a storing part 35 which receives and stores the binary image and the number of white groups and the number of black groups.

The part for distinguishing natural vibration mode 37 receives the number of white groups and the number of black groups which have been stored and tracked, and distinguishes the natural vibration mode to be tracked, from natural vibration modes of changed computer-aided design models according to the number of white groups and the number of black groups which have been received.

Next, the configuration of the structural optimization system 100 will be described concretely referring to FIG. 1.

The structural optimization system 100 includes a part for changing computer-aided design model 10, a part of calculation 20, a part for tracking natural vibration mode 30, a part for calculating optimum solution 40, and a display part 50. These parts are usually computer programs.

The part for changing computer-aided design model 10 receives a previously made computer-aided design model and design variables and changes (modifies) the model according to the design variables and outputs the changed computer-aided design model. Here a computer-aided design model refers to what shows coordinates of points constituting a line, relations with lines constituting a surface, and relations with surfaces constituting a volume. The computer-aided design model changed by the part for changing computer-aided design model 10 is sent to the part of calculation 20.

The part of calculation 20 receives a computer-aided design model changed by the part for changing computer-aided design model 10, carries out a mesh division process, calculates vibration characteristics given a boundary condition, a load condition, material constants and so on, and outputs a natural frequency and a natural vibration mode.

The part for tracking natural vibration mode 30 converts a natural vibration mode obtained by vibration characteristic calculation in the part of calculation 20 into an image composed of plural pixels and, by making a calculation on the image, outputs the order of the natural vibration mode to be tracked and its natural frequency. For this reason, the part for tracking natural vibration mode 30 includes a part for making gray scale image 32, a part of binarization 33, a part for extracting pattern information 34, a storing part 35, a part for distinguishing natural vibration mode 37, and a part for choosing main component 39. The part for distinguishing natural vibration mode 37 includes a first part for distinguishing natural vibration mode 37-1, a second part for distinguishing natural vibration mode 37-2, and a third part for distinguishing natural vibration mode 37-3.

Next, the processes carried out by the various parts of the part for tracking natural vibration mode 30 will be described referring to FIGS. 2 to 7.

Figure 2:
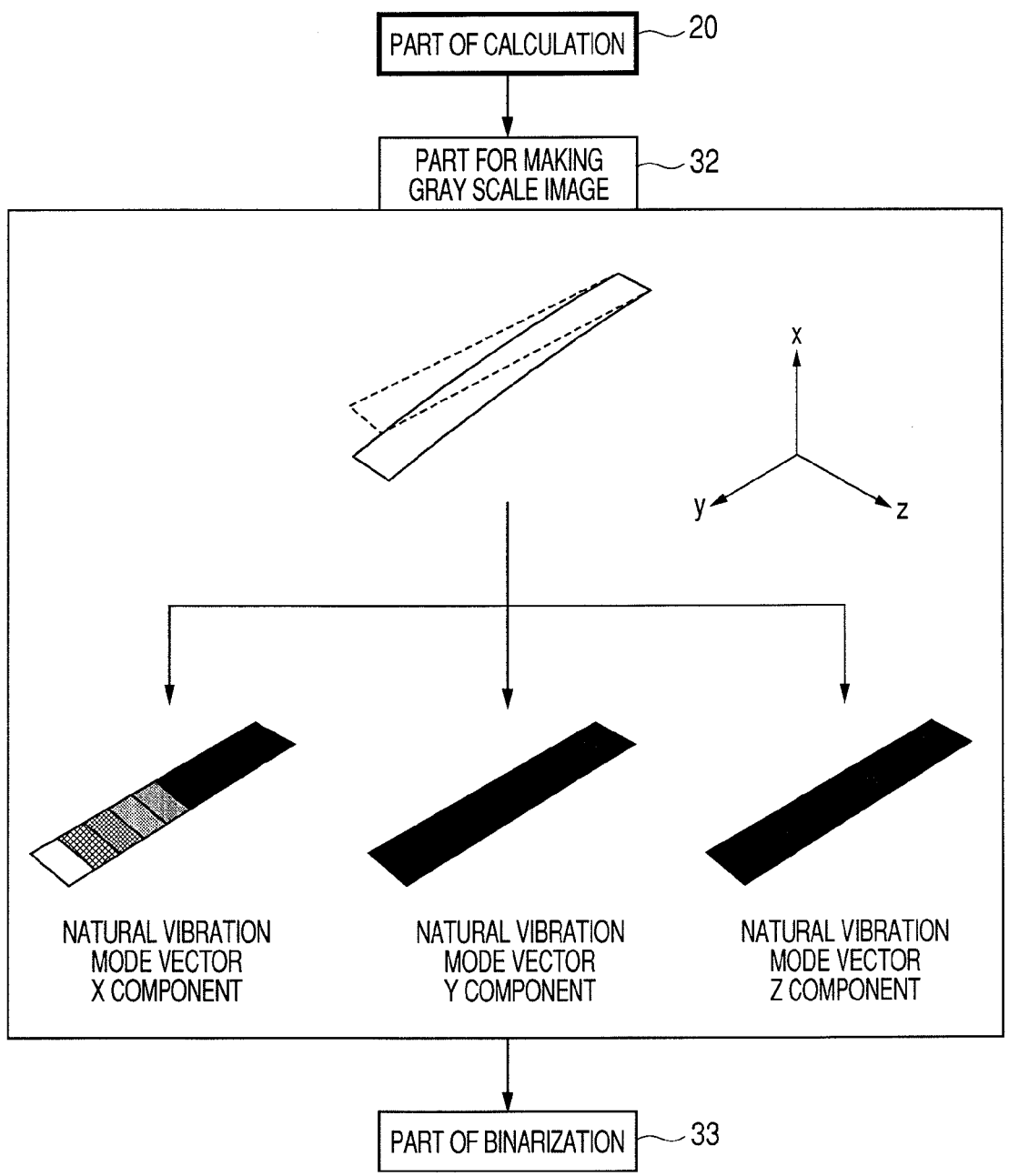
FIG. 2 illustrates the process carried out by a part for making gray scale image in the first embodiment.

First, the process carried out by the part for making gray scale image 32 will be described referring to FIG. 2. The part for making gray scale image 32 receives a natural vibration mode expressed as a 3D vector from the part of calculation 20 and calculates the absolute values (namely amplitudes) of the three components of the vector (X, Y, and Z components). It does not express amplitudes at different positions of the computer-aided design model as a change diagram but allocates colors to the positions according to amplitude. First, it calculates the maximum and minimum amplitudes and allocates white to the maximum amplitude and black to the minimum amplitude and tones to the other positions according to amplitude to make a gray scale image for each of the X, Y, and Z components and outputs these gray scale images. It carries out the above process on calculated natural vibration modes.

Figure 3:
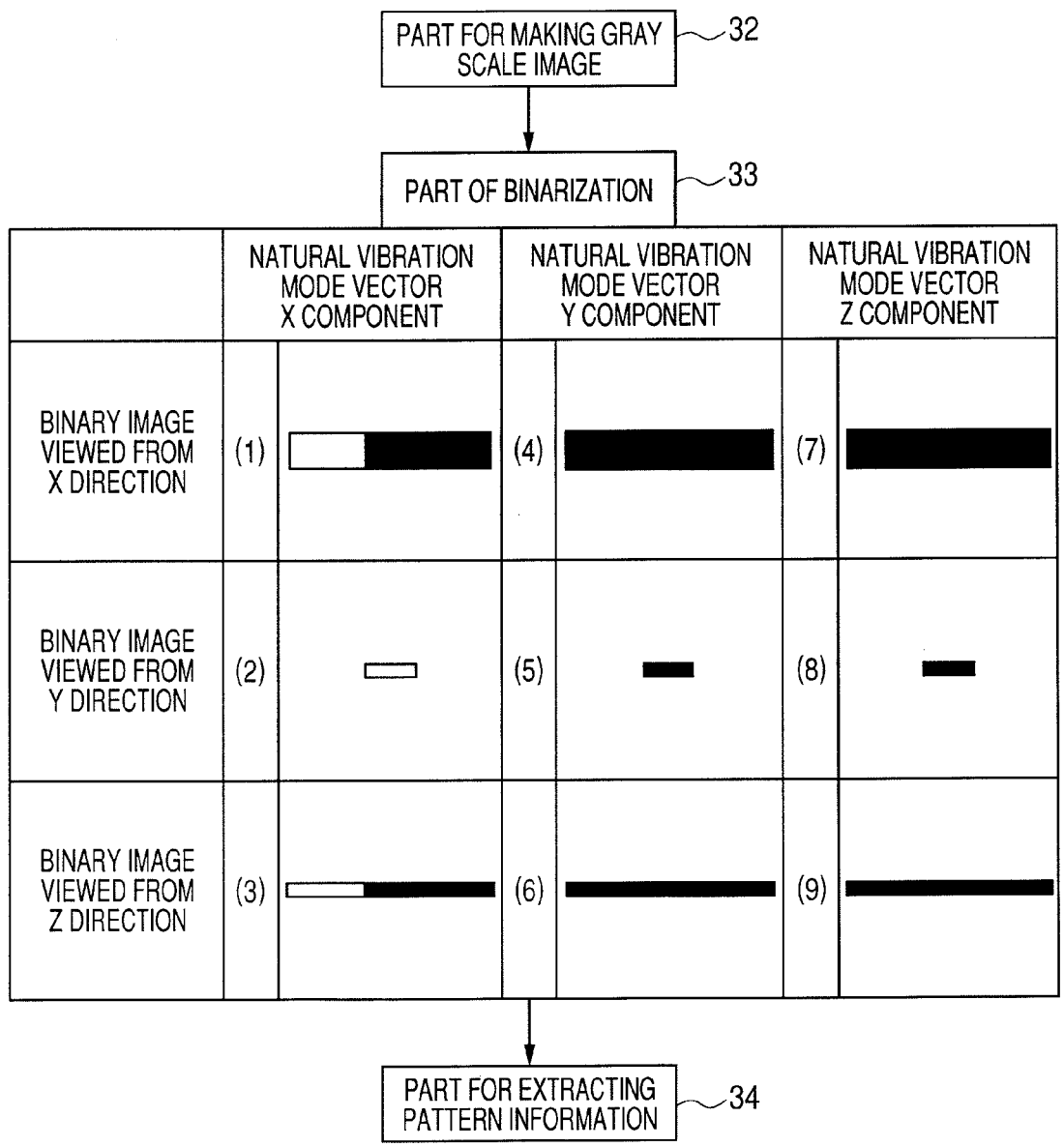
FIG. 3 illustrates the process carried out by a part of binarization in the first embodiment.

Next, the process carried out by the part of binarization 33 will be described referring to FIG. 3. The part of binarization 33 receives the gray scale images of the components made by the part for making gray scale image 32 and shows the image of each component as viewed from the three directions (X, Y, and Z), sets a threshold value for tones, and classifies pixels with tones above the threshold value as white and those with tones below the threshold value as black; consequently it makes and outputs a total of nine binary images (images of three components as viewed from three directions). Distinguishing accuracy is higher when gray scale images as viewed from three directions are shown than when gray scale images as viewed from only one direction are shown.

Figure 4:
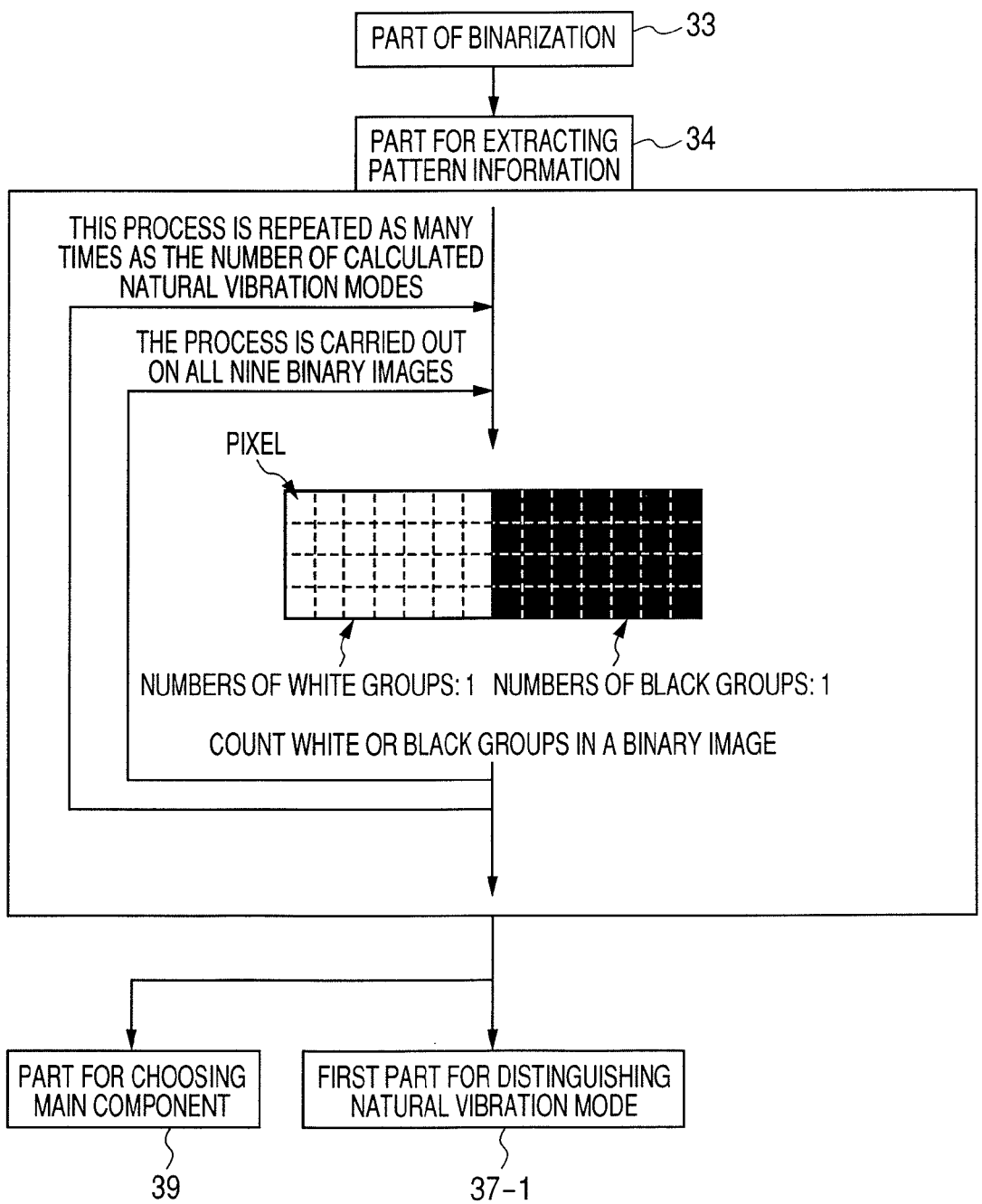
FIG. 4 illustrates the process carried out by a part for extracting pattern information in the first embodiment.

Next, the part for extracting pattern information 34 will be described referring to FIG. 4. The part for extracting pattern information 34 receives binary images made by the part of binarization 33, and taking a region with continuous white pixels in each binary image as one group, counts white groups. Similarly, taking a region with continuous black pixels as one group, it counts black groups. The numbers of white groups and black groups are regarded as pattern information. It outputs the numbers of white groups and black groups and the binary image used (pattern information). This process is carried out on nine images (1)-(9) shown in FIG. 3. Furthermore, this process is carried out on all calculated natural vibration modes.

For a first calculation for optimization, in the part for choosing main component 39, the numbers of white and black groups in binary images which represent characteristics of the natural vibration mode to be tracked are chosen and stored in the storing part 35. After deformation, the process goes to the part for distinguishing natural vibration mode 37. This process will be detailed below.

The part for choosing main component 39 receives the numbers of white groups and black groups and binary images from the part for extracting pattern information 34 and chooses binary images to be referred to as the natural vibration mode to be tracked, and chooses, among the chosen binary images, binary images showing a component with the largest natural vibration mode amplitude (hereinafter called a main component), and extracts the number of white groups and the number of black groups from the binary images. Among them, the numbers of white groups and black groups in the binary image viewed from the same direction as the main component (hereinafter called the main direction) are set as the numbers of white groups and black groups of the main component in the main direction. Then, only the chosen binary image of the main component and its numbers of white groups and black groups are outputted.

The storing part 35 receives the binary images with the natural vibration mode to be tracked and the numbers of white groups and black groups in the binary images which have been outputted from the part for choosing main component 39 and stores the received binary images and the numbers of white groups and black groups extracted from these binary images and, after deformation, outputs them to the first part for distinguishing natural vibration mode 37-1, the second part for distinguishing natural vibration mode 37-2, and the third part for distinguishing natural vibration mode 37-3.

First, the first part for distinguishing natural vibration mode 37-1 uses the numbers of white groups and black groups in the binary image viewed from the main direction, among binary images which best express characteristics of the natural vibration mode, namely binary images which express the main component. Distinguishing is done according to the degree of coincidence between the numbers of white groups before and after deformation and between the numbers of black groups before and after deformation. When it distinguishes successfully, the process goes to the next step for calculation for optimization; and when it fails to distinguish, the process goes to the second part for distinguishing natural vibration mode 37-2.

The second part for distinguishing natural vibration mode 37-2 uses the numbers of white groups in the binary images viewed from two directions other than the main direction, among the binary images which express the main component; it distinguishes according to the degree of coincidence between the numbers of white groups before and after deformation. When it distinguishes successfully, the process goes to the next step for calculation for optimization; and when it fails to distinguish, the process goes to the third part for distinguishing natural vibration mode 37-3.

The third part for distinguishing natural vibration mode 37-3 uses the numbers of black groups in the binary images viewed from two directions other than the main direction, among the binary images which express the main component; it distinguishes according to the degree of coincidence between the numbers of black groups before and after deformation. When it fails to distinguish, the system recognizes the case as an error.

Figure 5:
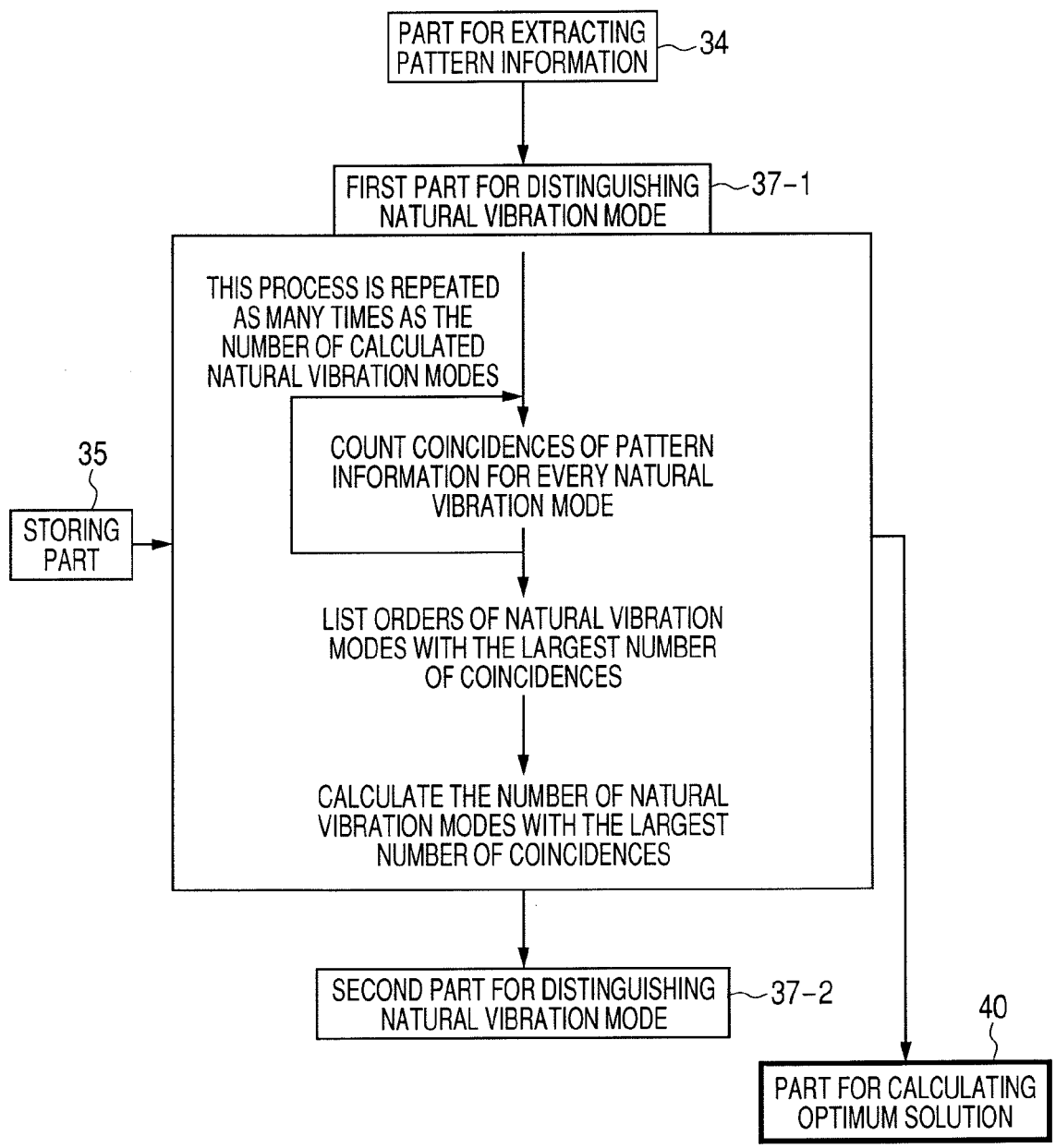
FIG. 5 illustrates the process carried out by a first part for distinguishing natural vibration mode in the first embodiment.

Next, the first part for distinguishing natural vibration mode 37-1 will be described referring to FIG. 5. The first part for distinguishing natural vibration mode 37-1 receives the numbers of white groups and black groups in the binary image viewed from the main direction among binary images expressing the main component which have been stored in the storing part 35, and the numbers of white groups and black groups in the binary image viewed from the main direction among deformed binary images outputted from the part for extracting pattern information 34 after computer-aided design model change. Then, it compares the number of white groups received from the storing part 35 with the number of white groups received from the part for extracting pattern information 34 and checks when the numbers of groups coincide. Similarly, it compares the number of black groups received from the storing part 35 with the number of black groups received from the part for extracting pattern information 34 and checks when the numbers of groups coincide. Then, it checks the degree of coincidence, namely counts coincidences. This process is carried out on all calculated natural vibration modes. The orders of natural vibration modes with the largest number of coincidences are listed. When there are plural natural vibration modes considered identical, the orders of listed natural vibration modes are sent to the second part for distinguishing natural vibration mode 37-2. When there are plural natural vibration modes to be tracked, this process is repeated.

Figure 6:
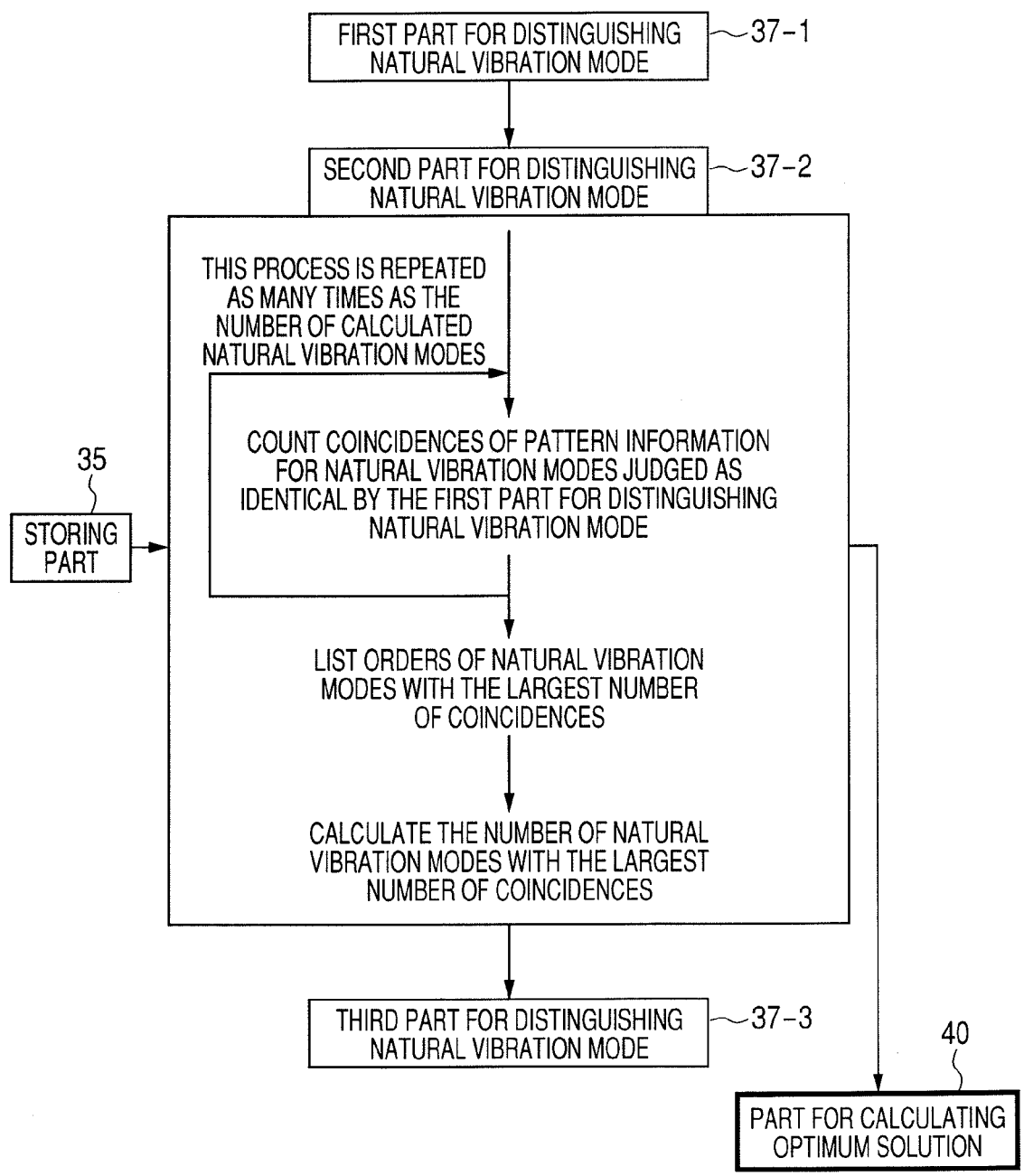
FIG. 6 illustrates the process carried out by a second part for distinguishing natural vibration mode in the first embodiment.

Next, the second part for distinguishing natural vibration mode 37-2 will be detailed referring to FIG. 6. The second part for distinguishing natural vibration mode 37-2 receives the numbers of white groups in two binary images viewed from two directions other than the main direction, among the binary images expressing the main component which have been outputted from the storing part 35, and the numbers of white groups in two binary images viewed from two directions other than the main direction, among the binary images expressing the main component which have been outputted from the part for extracting pattern information 34 after computer-aided design model change. It compares the numbers of white groups received from the storing part 35 with the numbers of white groups received from the part for extracting pattern information 34 and counts coincidences. This process is carried out on all natural vibration modes that the first part for distinguishing natural vibration mode 37-1 has judged as identical to the natural vibration mode to be tracked. The orders of the natural vibration modes with the largest number of coincidences are listed and the number of listed natural vibration modes is calculated. When there are plural natural vibration modes considered identical, the orders of listed natural vibration modes are outputted to the third part for distinguishing natural vibration mode 37-3. When there are plural natural vibration modes to be tracked, this process is repeated.

Figure 7:
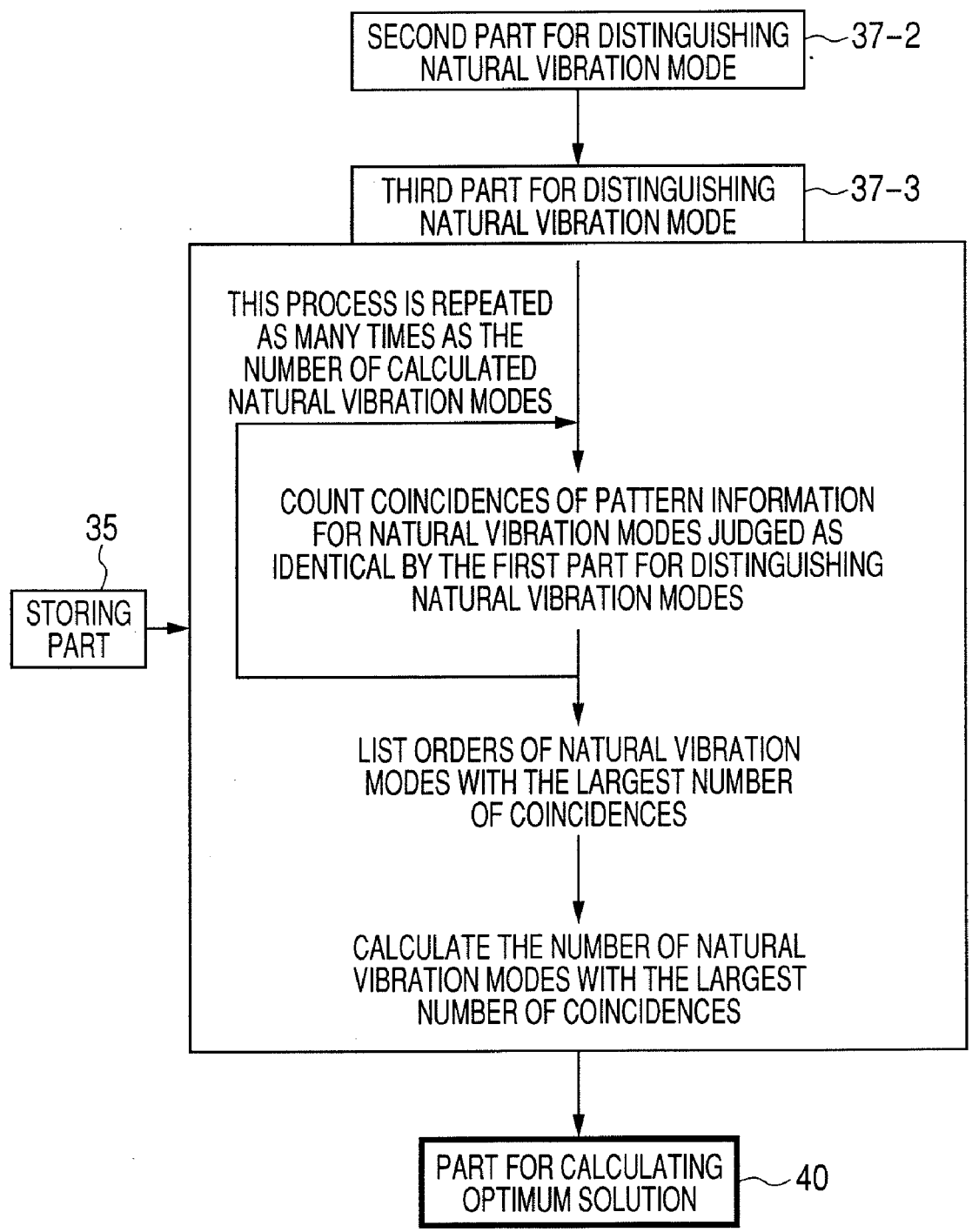
FIG. 7 illustrates the process carried out by a third part for distinguishing natural vibration mode in the first embodiment.

Next, the third part for distinguishing natural vibration mode 37-3 will be detailed referring to FIG. 7. The third part for distinguishing natural vibration mode 37-3 receives the numbers of black groups in two binary images viewed from two directions other than the main direction, among the binary images expressing the main component which have been outputted from the storing part 35, and the numbers of black groups in two binary images viewed from two directions other than the main direction, among the binary images expressing the main component which have been outputted from the part for extracting pattern information 34 after computer-aided design model change. It compares the numbers of black groups received from the storing part 35 with the numbers of black groups received from the part for extracting pattern information 34 and counts coincidences. This process is carried out on all calculated natural vibration modes. The orders of natural vibration modes with the largest number of coincidences are listed and the number of listed natural vibration modes is calculated. When it distinguishes the natural vibration mode to be tracked from among the calculated natural vibration modes, it outputs the order of the natural vibration mode considered identical, to the part for calculating optimum solution 40. When there are plural natural vibration modes to be tracked, this process is repeated.

The part for calculating optimum solution 40 makes a calculation to see whether or not the computer-aided design model changed by the part for changing computer-aided design model 10 satisfies the convergence condition, namely whether or not it is optimum. It specifies conditions necessary for calculation such as objective function and constraint condition and calculates an optimum design variable which maximizes or minimizes the objective function under the constraint condition, and evaluates the computer-aided design model based on the calculated design variable, and when the model does not satisfy the convergence condition, it is returned to the part for changing computer-aided design model 10 where it is re-changed.

The display part 50 displays the computer-aided design model judged as optimum by the part for calculating optimum solution 40, on a display screen (not shown)

The structural optimization system 100 in this embodiment includes: a part for changing computer-aided design model 10 which changes a computer-aided design model according to a design variable and outputs it; a part of calculation 20 which calculates natural vibration modes and natural frequencies and outputs them; a part for making gray scale image 32 which makes a natural vibration mode image as a visualized form of natural vibration mode; a part of binarization 33 which binarizes a natural vibration mode image by a threshold value to make a binary image; a part for extracting pattern information 34 which extracts pattern information from a binary image and outputs it together with the binary image; a part for distinguishing natural vibration mode 37 which distinguishes the natural vibration mode to be tracked from natural vibration modes after computer-aided design model change, using pattern information, and outputs it; and a part for calculating optimum solution 40 which finds a design variable which makes the natural frequency of a natural vibration mode a target value and outputs it, so that natural vibration modes can be easily distinguished and tracked through computer-aided design model change involved in structural design, supporting vibration-related design work more effectively.

Second Embodiment

Figure 8:
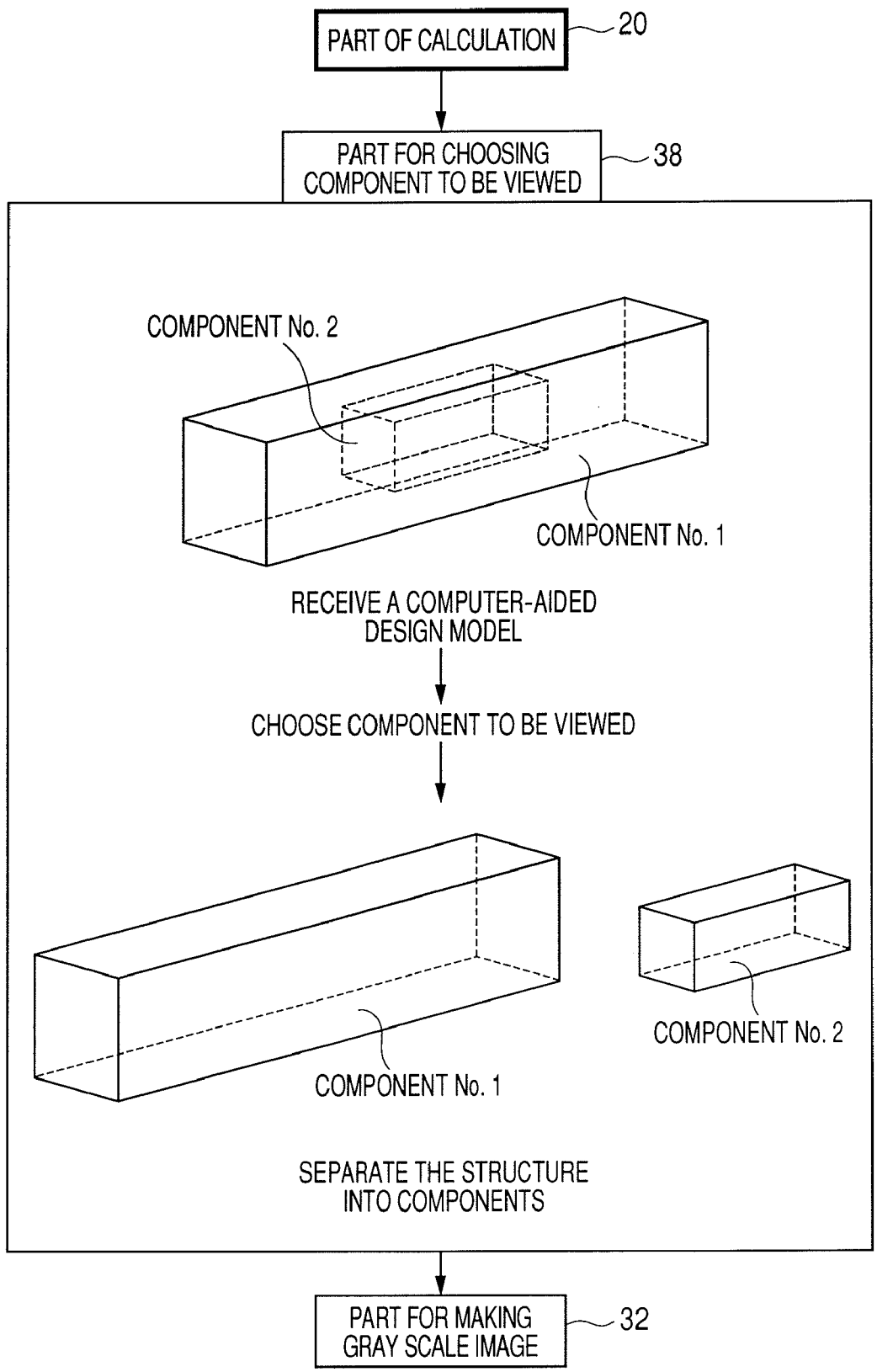
FIG. 8 illustrates the process carried out by a part for choosing component to be viewed in a structural optimization system according to a second embodiment of the invention.

A structural optimization system according to a second embodiment of the present invention will be described referring to FIG. 8. As shown in FIG. 8, in the second embodiment, a part for choosing component to be viewed 38 is newly added before the part for making gray scale image 32 so that only components of a structure which are used for distinguishing can be chosen. The part 38 receives a computer-aided design model with numbered components and chooses components necessary for distinguishing from the model and outputs chosen component models one by one. In the second embodiment, the other steps are the same as in the first embodiment. The second embodiment makes it easier to distinguish natural vibration modes for a structure with components invisible from outside than the first embodiment.

Third Embodiment

Figure 9:
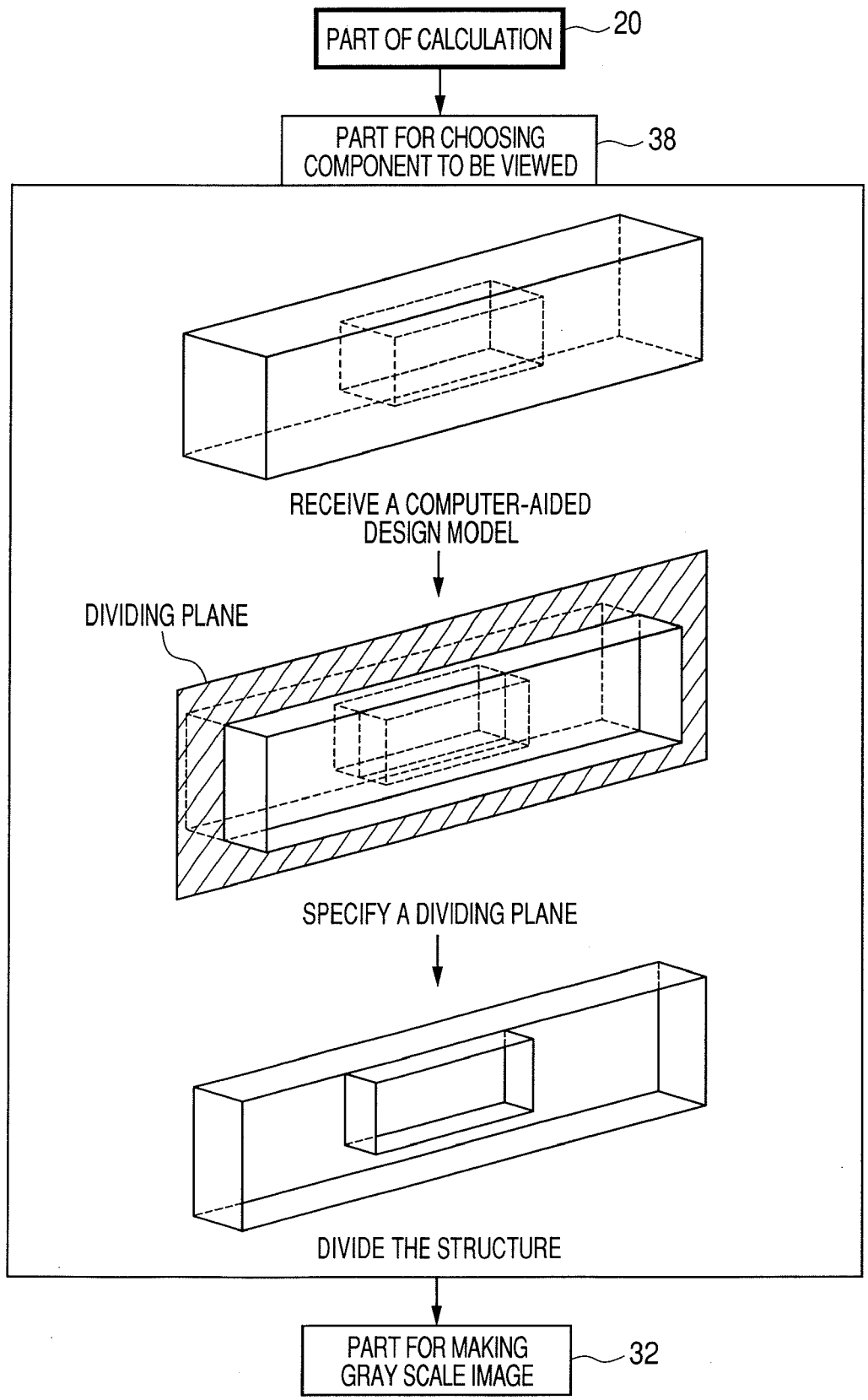
FIG. 9 illustrates the process carried out by a part for choosing component to be viewed in a structural optimization system according to a third embodiment of the invention.

A structural optimization system according to a third embodiment of the present invention will be described referring to FIG. 9. As shown in FIG. 9, in the third embodiment, the part for choosing component to be viewed 38 according to the second embodiment receives a computer-aided design model, determines a cross section point of the model, divides the model at this point and outputs the sectionally divided model. In the third embodiment, the other steps are the same as in the first embodiment. The third embodiment makes it more efficient to distinguish natural vibration modes for a multilayered structure than the second embodiment because a single sectional view shows its inside without the need for showing its layers one by one.

Fourth Embodiment

Figure 10:
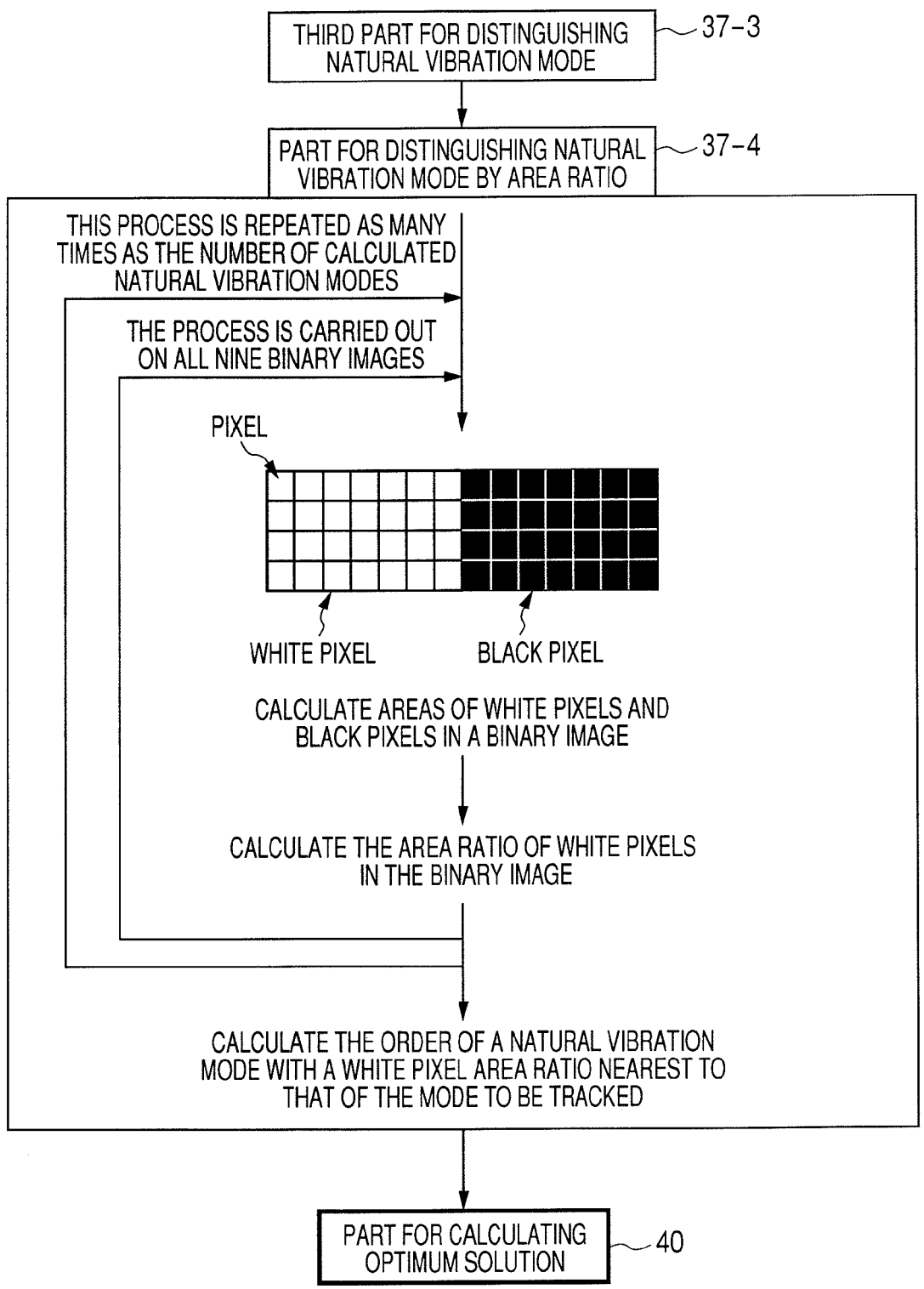
FIG. 10 illustrates the process carried out by a part for distinguishing natural vibration mode by area ratio in a structural optimization system according to a fourth embodiment of the invention.

A structural optimization system according to a fourth embodiment of the present invention will be described referring to FIG. 10. As shown in FIG. 10, in the fourth embodiment, a part for distinguishing natural vibration mode by area ratio 37-4 is newly added after the third part for distinguishing natural vibration mode 37-3 according to the first to third embodiments so that natural vibration modes are distinguished according to the area ratio of white pixels in a binary image (hereinafter called area ratio). The part for distinguishing natural vibration mode by area ratio 37-4 receives binary images from the storing part 35 and the orders of natural vibration modes considered identical by the third part for distinguishing natural vibration mode 37-3, calculates the area ratio of white pixels in binary images and considers the mode with a white pixel area ratio nearest to that of the natural vibration mode to be tracked to be an identical natural vibration mode. In the fourth embodiment, the other steps are the same as in the first to third embodiments. In this embodiment, natural vibration modes which could not be distinguished in the first to third embodiments can be distinguished.

Fifth Embodiment

Figure 11:
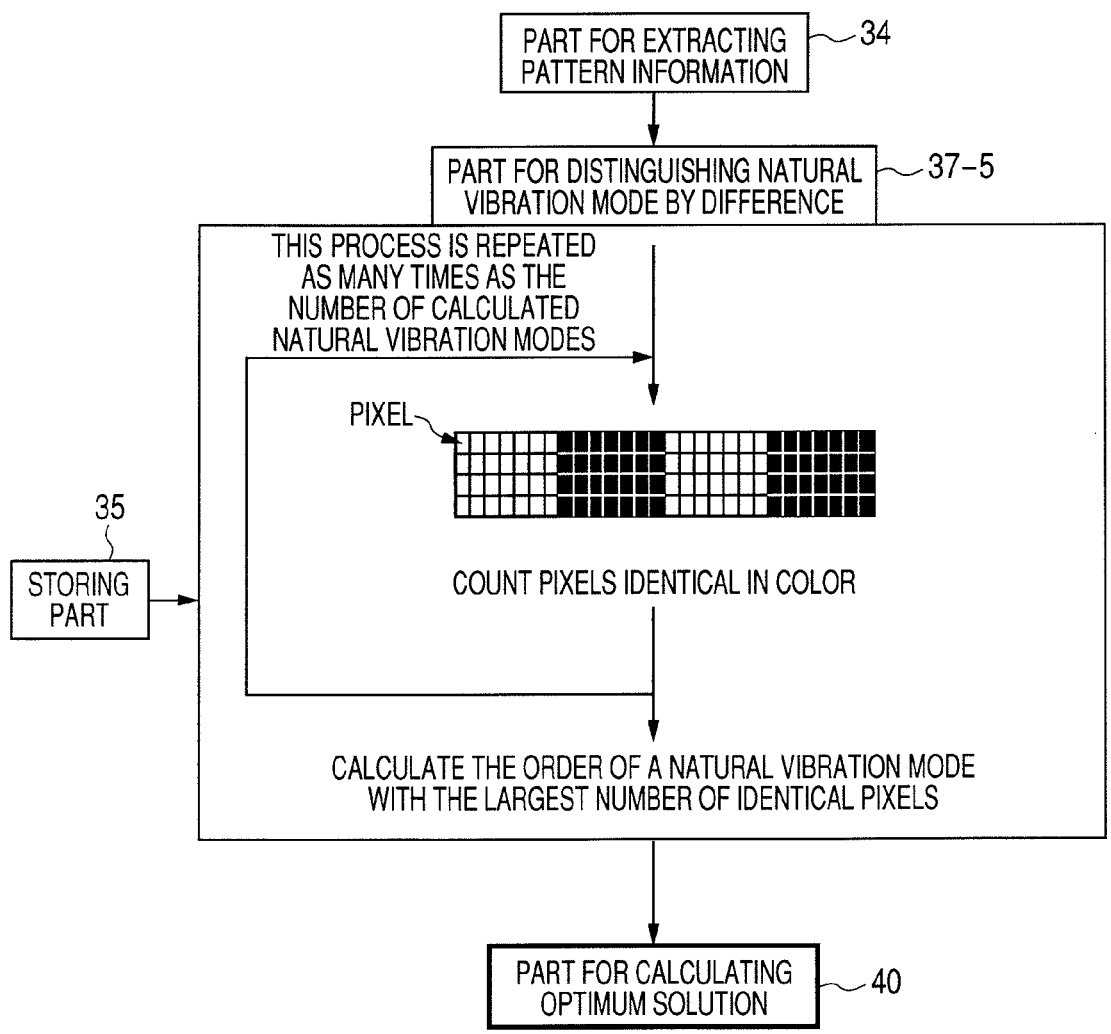
FIG. 11 illustrates the process carried out by a part for distinguishing natural vibration mode by difference in a structural optimization system according to a fifth embodiment of the invention.

A structural optimization system according to a fifth embodiment of the present invention will be described referring to FIG. 11. As shown in FIG. 11, in the fifth embodiment, a part for distinguishing natural vibration mode by difference 37-5 is provided instead of the first part for distinguishing natural vibration mode 37-1 to the third part for distinguishing natural vibration mode 37-3 in the first embodiment. The part for distinguishing natural vibration mode by difference 37-5 receives a binary image with the natural vibration mode to be tracked from the storing part 35 and binary images with natural vibration modes from the part for extracting pattern information 34 and counts pixels which are identical in color and position to the stored image. This process is carried out on all calculated natural vibration modes and one with the largest number of identical pixels is considered identical to the natural vibration mode to be tracked. When there are plural natural vibration modes to be tracked, this process is repeated. In this embodiment, higher-order natural vibration modes can be distinguished than in the first to fourth embodiments.

Sixth Embodiment

Figure 12:
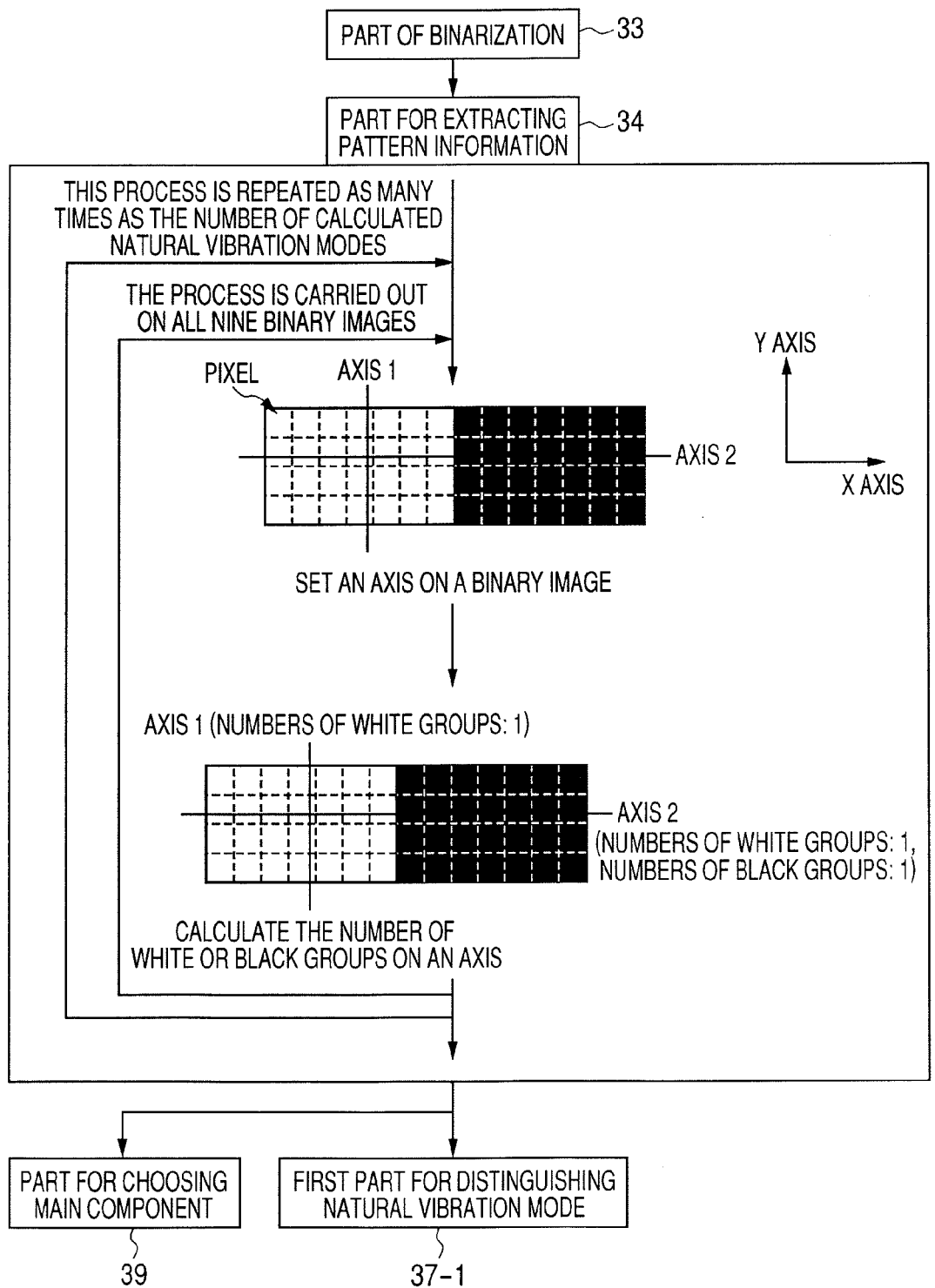
FIG. 12 illustrates the process carried out by a part for extracting pattern information in a structural optimization system according to a sixth embodiment of the invention.

A structural optimization system according to a sixth embodiment of the present invention will be described referring to FIG. 12. As shown in FIG. 12, in the sixth embodiment, the part for extracting pattern information 34 according to the first to fourth embodiments receives a binary image, sets an axis parallel to a coordinate axis on the binary image, calculates the number of groups on the axis, and outputs it. Here an axis may be freely set.

Seventh Embodiment

Figure 13:
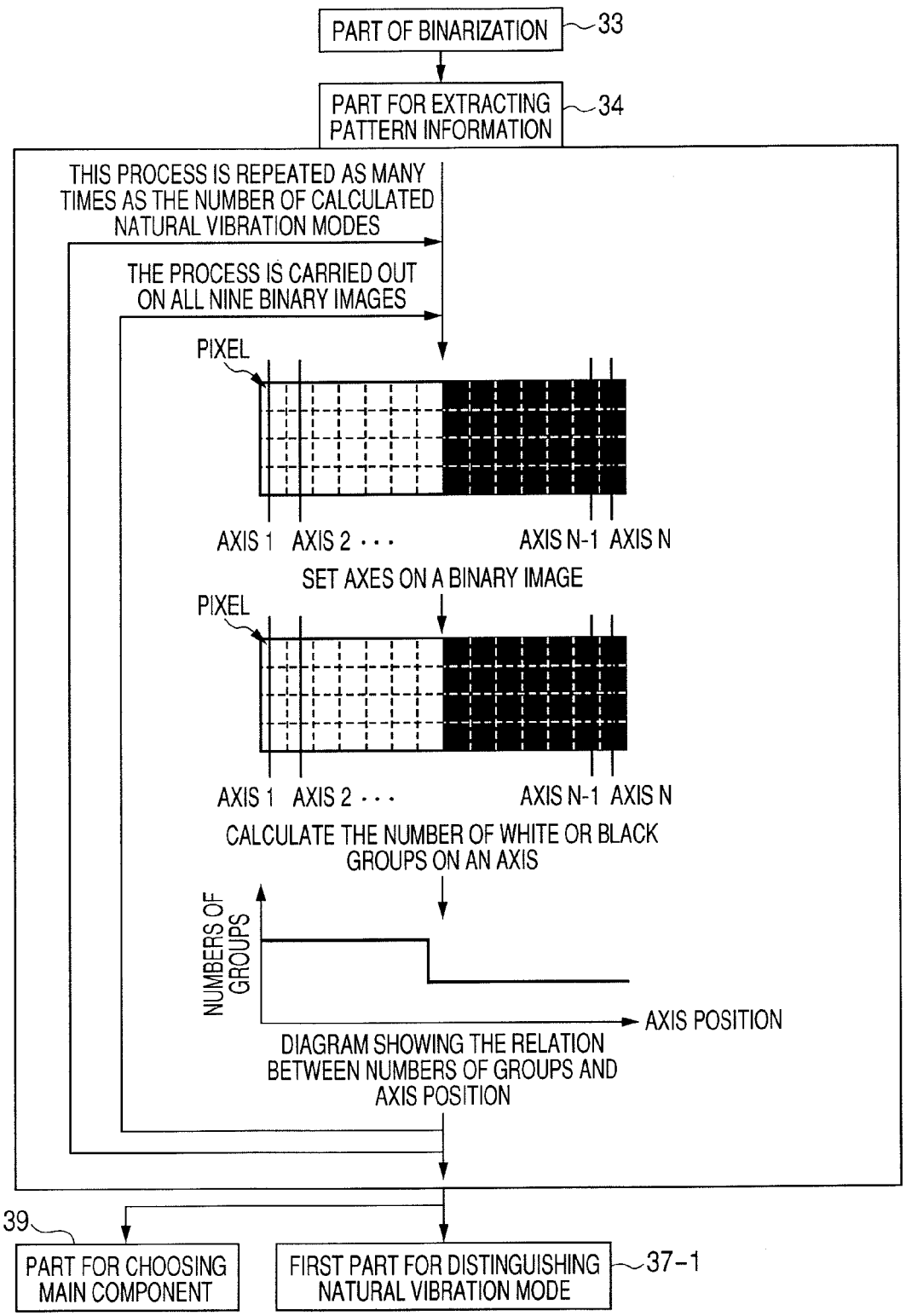
FIG. 13 illustrates the process carried out by a part for extracting pattern information in a structural optimization system according to a seventh embodiment of the invention.

A structural optimization system according to a seventh embodiment of the present invention will be described referring to FIGS. 13 and 14. As shown in FIG. 13, in the seventh embodiment, the part for extracting pattern information 34 according to the fifth embodiment receives a binary image and sets plural parallel axes at regular intervals and counts white or black groups on these axes. A diagram showing the relation between the number of white or black groups on an axis and the position of the axis may be outputted as pattern information.

Figure 14:
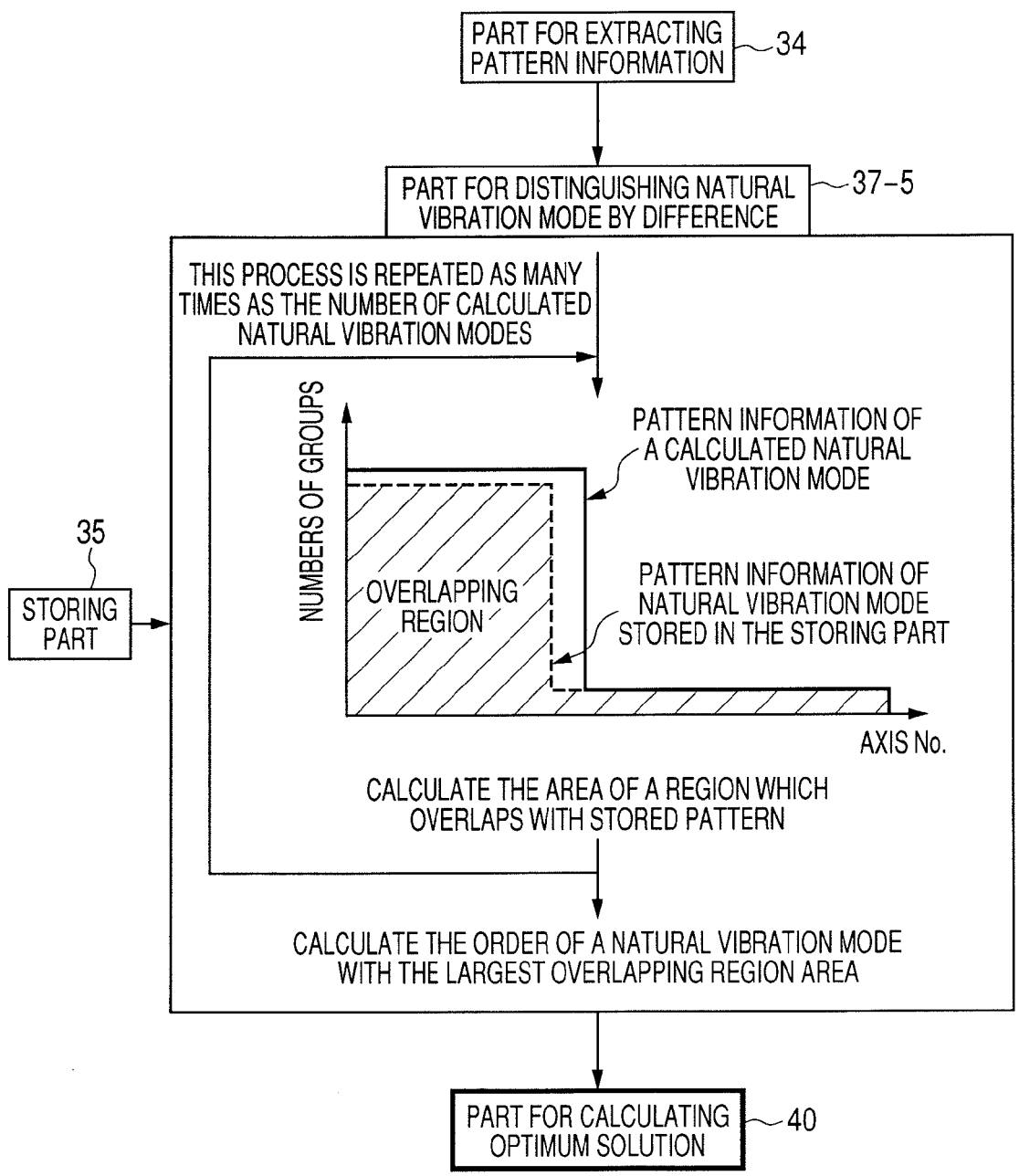
FIG. 14 illustrates the process carried out by a part for distinguishing natural vibration mode by difference in the structural optimization system according to the seventh embodiment of the invention.
Figure 15:
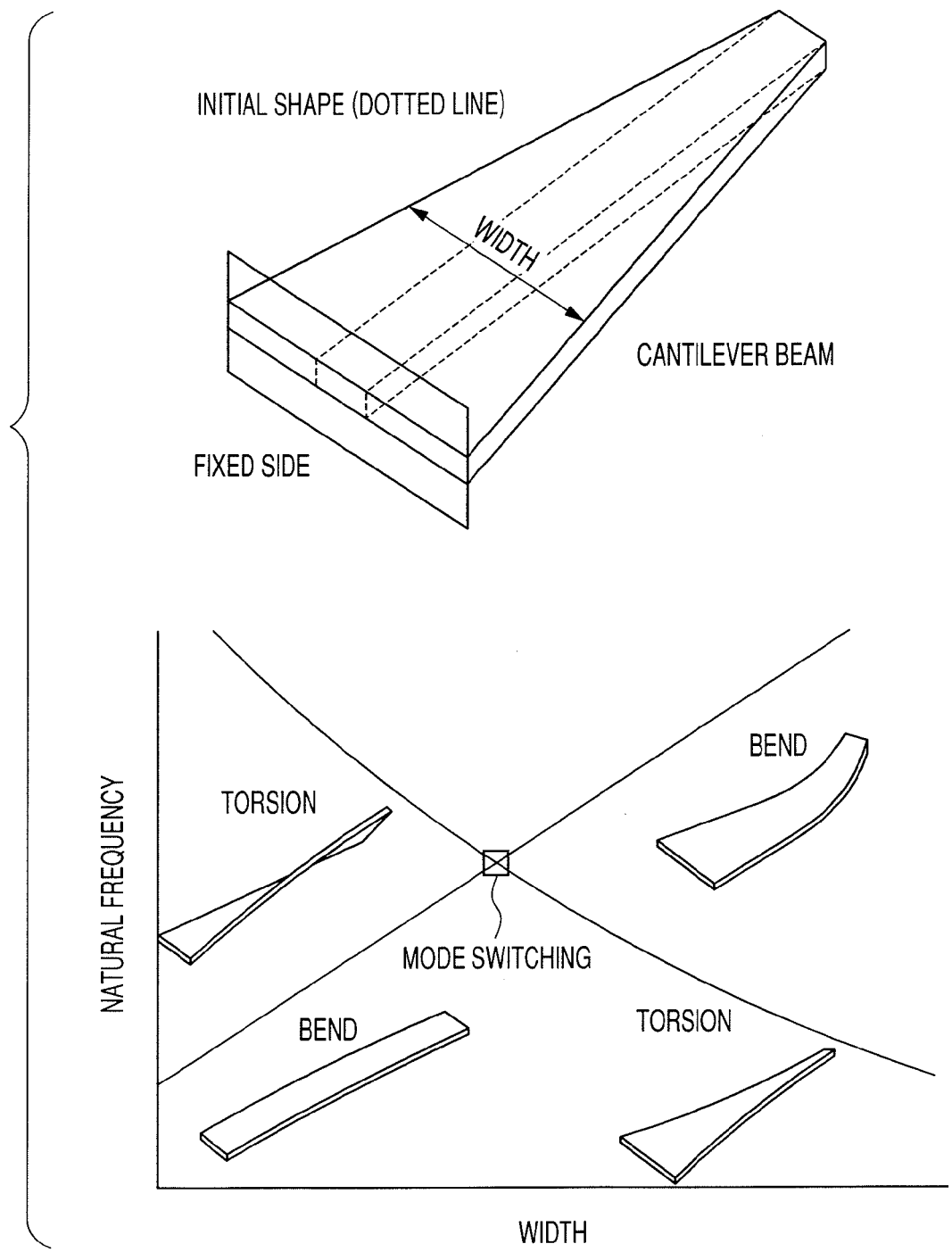
FIG. 15 illustrates how natural vibration modes for a cantilever beam are switched.
Figure 16:
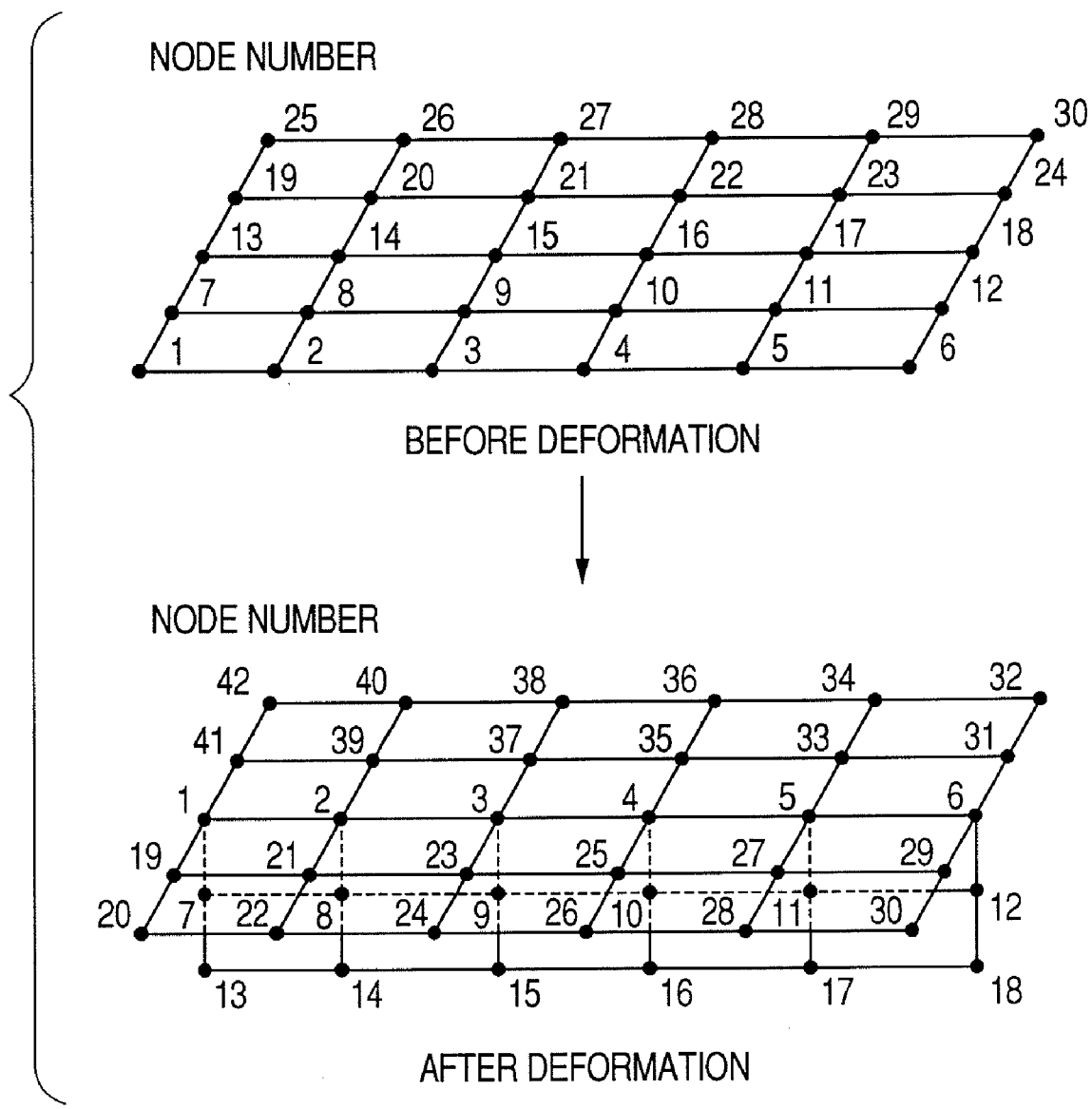
FIG. 16 illustrates how nodes in a discrete space lattice are renumbered upon computer-aided design model change.

In addition, as shown in FIG. 14, the part for distinguishing natural vibration mode by difference 37-5 receives pattern information from the part for extracting pattern information 34 and pattern information from the storing part and calculates the area of a region where the patterns overlap and distinguishes a natural vibration mode with the largest overlapping region area as the natural vibration mode to be tracked and outputs the order of that natural vibration mode.

Other Embodiments

Another embodiment of the present invention is a variation of any of the first to seventh embodiments in which when no natural vibration mode considered identical is found, the process returns to the part of binarization 33, the threshold value is increased or decreased and the distinguishing process is carried out again.

A further possible embodiment of the invention is a variation of any of the above embodiments in which the storing part 35 updates the binary image and pattern information upon each deformation and uses the (k−1)th binary image and its pattern information in distinguishing the k-th natural vibration mode. It is also possible that the storing part 35 stores the (k−m)th binary image and its pattern information (m=1, 2, . . . , k−1) and uses them in distinguishing the k-th natural vibration mode.

A further possible embodiment of the invention is a variation of any of the above embodiments in which an object is viewed from n directions (n≧4) in the part of binarization 33.

It is also possible that the part for making gray scale image 32 according to the above embodiments uses a coordinate system other than a Cartesian coordinate system as used in the above embodiments (for example, a cylindrical coordinate system or a spherical coordinate system) for natural vibration mode vector components.

A further possible embodiment of the invention is that whereas the above embodiments make gray scale images showing stepwise the natural vibration mode components expressed as 3D vectors, strain energy densities or kinetic energy densities are used for components to be viewed. Also, instead of binary images in white and black, binary images in other colors may be made.

What is claimed is:

1. A structural optimization system comprising:
   a part for changing computer-aided design model which receives a computer-aided design model and a design variable and changes the computer-aided design model according to the design variable and outputs it;
   a part of calculation which receives a computer-aided design model from the part for changing computer-aided design model and calculates a natural vibration mode and a natural frequency and outputs them;
   a part for making natural vibration mode image which receives a natural vibration mode from the part of calculation and makes a natural vibration mode image as a visualized form of the natural vibration mode and outputs it;
   a part of binarization which receives a natural vibration mode image from the part for making natural vibration mode image and binarizes the natural vibration mode image by a threshold value and outputs a binary image;
   a part for extracting pattern information which receives a binary image from the part of binarization and extracts pattern information from the binary image and outputs it together with the binary image;
   a part for distinguishing natural vibration mode which receives a binary image from the part of binarization and pattern information from the part for extracting pattern information and distinguishes the natural vibration mode to be tracked from natural vibration modes after computer-aided design model change using the pattern information and outputs it; and
   a part for calculating optimum solution which receives a natural vibration mode from the part for distinguishing natural vibration mode and finds a design variable which makes the natural frequency of the natural vibration mode a target value and outputs it.

2. The structural optimization system according to claim 1, wherein the part for distinguishing natural vibration mode includes:
   a first part for distinguishing natural vibration mode which distinguishes a natural vibration mode considered identical to the natural vibration mode to be tracked using, out of pattern information on a main component best expressing characteristics of a natural vibration mode from the part for extracting pattern information, pattern information viewed from the same main direction as the main component, and outputs it; and
   a second part for distinguishing natural vibration mode which, when the first part for distinguishing natural vibration mode cannot distinguish a natural vibration mode considered identical to the natural vibration mode to be tracked, distinguishes a natural vibration mode considered identical to the natural vibration mode to be tracked, using, out of the pattern information on the main component, pattern information viewed from a direction other than the main direction, and outputs it; and
   wherein the part for calculating optimum solution receives a natural vibration mode from the first part for distinguishing natural vibration mode and the second part for distinguishing natural vibration mode and finds a design variable which makes the natural frequency of the natural vibration mode a target value, and outputs it.

3. The structural optimization system according to claim 2, wherein: the part for making natural vibration mode image is a part for making gray scale image which makes a gray scale image which expresses a natural vibration mode from the part of calculation by amplitude or expresses a strain energy distribution or a kinetic energy distribution of vibration in the natural vibration mode by color tones and regards it the natural vibration mode image;
   the part of binarization sets a threshold value for tones in a gray scale image made by the part for making gray scale image and divides the image into white pixel regions and black pixel regions to make a binary image;
   the part for extracting pattern information counts a series of white pixels in a binary image extracted by the part of binarization as one group and a series of black pixels in it as one group and extracts the number of white groups and the number of black groups as pattern information;
   the first part for distinguishing natural vibration mode distinguishes a natural vibration mode considered identical to the natural vibration mode to be tracked, from natural vibration modes after computer-aided design model change, using the number of white groups and the number of black groups as the pattern information, and outputs it; and
   the second part for distinguishing natural vibration mode distinguishes a natural vibration mode considered identical to the natural vibration mode to be tracked, from natural vibration modes after computer-aided design model change, using the number of white groups and the number of black groups as the pattern information, and outputs it.

4. The structural optimization system according to claim 1, further comprising:
   a part for choosing main component which receives the binary images and pattern information extracted by the part for extracting pattern information, chooses a binary image with a natural vibration mode referred to as the natural vibration mode to be tracked, chooses a binary image of a component in which the amplitude of the chosen natural vibration mode or strain energy or kinetic energy of vibration in the natural vibration mode is maximum, and outputs a binary image expressing the component and its pattern information; and
   a storing part which receives the binary image and pattern information chosen by the part for choosing main component and stores and outputs it,
   wherein the part for distinguishing natural vibration mode compares a binary image and pattern information of an unchanged computer-aided design model from the storing part, with a binary image and pattern information of a changed computer-aided design model from the part for extracting pattern information, and distinguishes a natural vibration mode considered identical to the natural vibration mode to be tracked, from natural vibration modes after computer-aided design model change.

5. The structural optimization system according to claim 3, further comprising:

a part for choosing main component which receives the binary images and pattern information including the number of white groups and the number of black groups, extracted by the part for extracting pattern information, chooses a binary image with a natural vibration mode referred to as the natural vibration mode to be tracked, chooses a binary image of a component in which the amplitude or strain energy of the chosen natural vibration mode is maximum, and outputs a binary image expressing the component and its pattern information including the number of white groups and the number of black groups; and a storing part which receives the binary image chosen by the part for choosing main component and its pattern information including the number of white groups and the number of black groups, and stores and outputs them, wherein the first part for distinguishing natural vibration mode compares a binary image and pattern information of an unchanged computer-aided design model from the storing part, with a binary image and pattern information of a changed computer-aided design model from the part for extracting pattern information, and distinguishes a natural vibration mode considered identical to the natural vibration mode to be tracked, from natural vibration modes after computer-aided design model change, and the second part for distinguishing natural vibration mode compares a binary image and pattern information of an unchanged computer-aided design model from the storing part, with a binary image and pattern information of a changed computer-aided design model from the first part for distinguishing natural vibration mode, and distinguishes a natural vibration mode considered identical to the natural vibration mode to be tracked, from natural vibration modes after computer-aided design model change.

6. The structural optimization system according to claim 1, further comprising a part for choosing component to be viewed which receives a computer-aided design model calculated by the part of calculation, chooses a component necessary for distinguishing, from the computer-aided design model and outputs only the chosen component.

7. The structural optimization system according to claim 1, further comprising a part for choosing component to be viewed which receives a computer-aided design model calculated by the part of calculation, specifies a cross section point of the computer-aided design model, divides the model at this point and outputs the sectionally divided model.

8. The structural optimization system according to claim 3, wherein: the part for making natural vibration mode image is a part for making gray scale image which makes a gray scale image which expresses a natural vibration mode from the part of calculation by color tones according to amplitude or strain energy and regards it the natural vibration mode image;

the part of binarization sets a threshold value for tones in a gray scale image from the part for making gray scale image and divides the image into black pixel regions and white pixel regions to make a binary image; and the system further comprises a part for distinguishing natural vibration mode by area ratio which receives a binary image made by the part of binarization and calculates the area ratio of white pixels in the binary image and distinguishes, based on the ratio, a natural vibration mode considered identical to the natural vibration mode to be tracked, from natural vibration modes after computer-aided design model change, and outputs it.

9. The structural optimization system according to claim 1, wherein the part for distinguishing natural vibration mode receives a binary image with a natural vibration mode referred to as the natural vibration mode to be tracked, and a binary image with a natural vibration mode from the part for extracting pattern information, and counts pixels with identical colors in identical positions between the binary image with the natural vibration mode to be tracked and a binary image with a natural vibration mode calculated after computer-aided design model change, and distinguishes a natural vibration mode with the largest number of such pixels as identical to the natural vibration mode to be tracked.

* * * * *